United States Patent [19]

Liu

[11] Patent Number: 4,933,860

[45] Date of Patent: Jun. 12, 1990

[54] METHOD FOR FABRICATING A RADIO FREQUENCY INTEGRATED CIRCUIT AND PRODUCT FORMED THEREBY

[75] Inventor: Louis C. Liu, Irvine, Calif.

[73] Assignee: TRW Inc., Redondo Beach, Calif.

[21] Appl. No.: 197,067

[22] Filed: May 20, 1988

[51] Int. Cl.⁵ .............................................. G06F 15/20
[52] U.S. Cl. .................................... 364/490; 364/489; 364/488; 307/490
[58] Field of Search ............... 364/488, 489, 490, 491, 364/578; 371/17, 23, 24, 25; 307/219; 324/73 PC, 76 A

[56] References Cited

U.S. PATENT DOCUMENTS 4,641,108 2/1987 Gill, Jr. ................................ 357/45

Primary Examiner—Parshotam S. Lall
Assistant Examiner—V. N. Trans
Attorney, Agent, or Firm—Ronald M. Goldman; Ronald L. Taylor

[57] ABSTRACT

A method of designing and fabricating a semiconductor integrated circuit for operation at radio frequencies. The method includes fabricating an integrated circuit having circuit components, at least one of which is an active device, testing the electrical performance of at least one of the active devices and then forming an electrical conductor to the integrated circuit to interconnect selected ones of the circuit components to form a radio frequency circuit, wherein the selection is based on the outcome of the electrical performance test.

10 Claims, 1 Drawing Sheet

U.S. Patent  Jun. 12, 1990  4,933,860
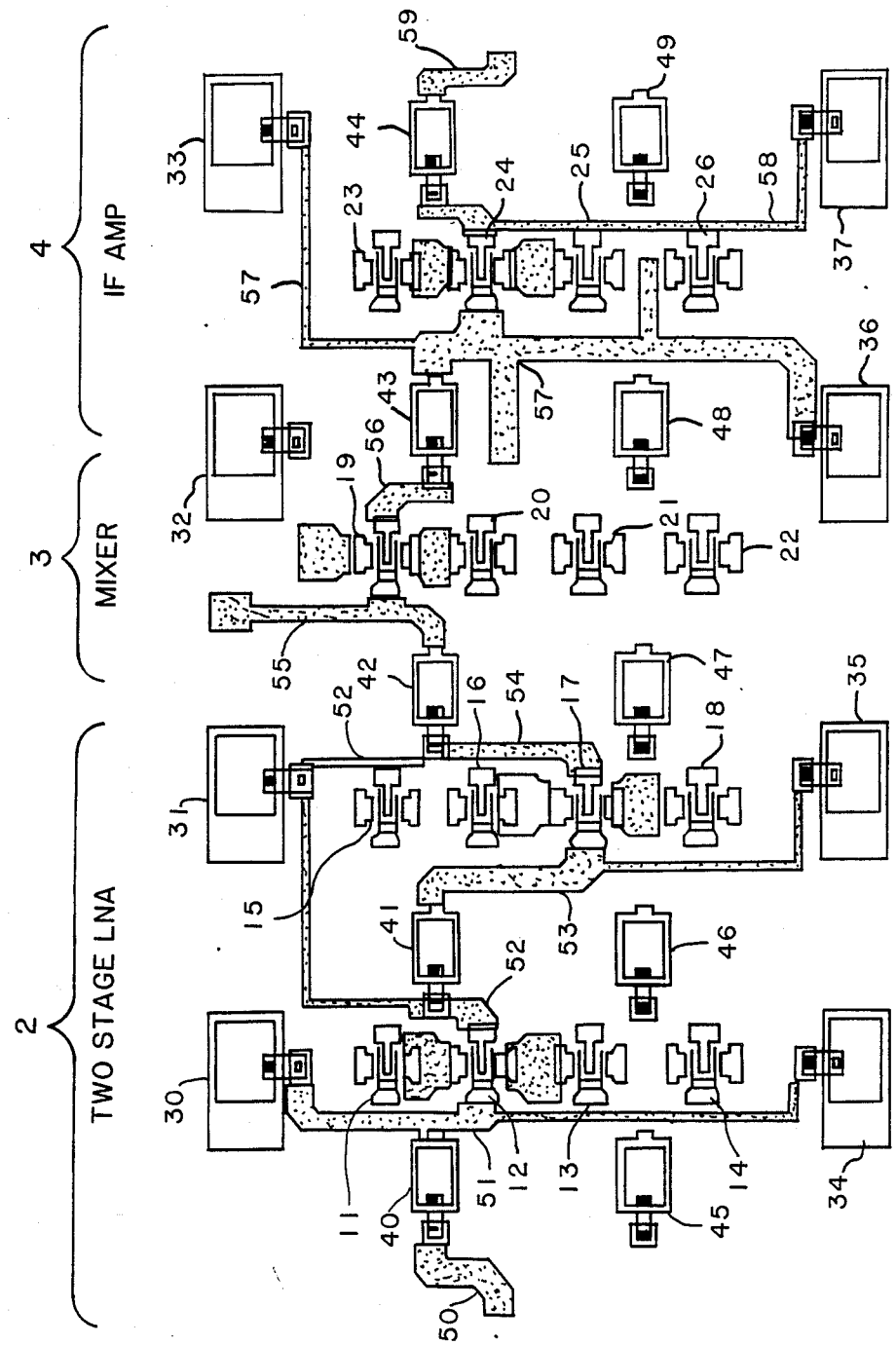

METHOD FOR FABRICATING A RADIO FREQUENCY INTEGRATED CIRCUIT AND PRODUCT FORMED THEREBY

BACKGROUND OF THE INVENTION

1. Field of the Invention

The present invention relates to radio frequency integrated circuit chips. More specifically, it relates to a method of fabricating such circuits using redundant components on the chip.

2. Description of the Prior Art

An important factor in determining the cost of manufacturing an integrated circuit chip is the number of non-defective integrated circuits than can be fabricated from each semiconductor wafer. Typically, an integrated circuit contains a large number of active devices such as transistors, and a manufacturing defect which causes only one active device to be inoperative usually makes the entire integrated circuit defective. It would be desireable to manufacture integrated circuits in such a way that such a defect could somehow be circumvented to avoid the need to discard the remaining good components of the integrated circuit.

In ultra-large scale digital integrated circuits, redundant subcircuits are sometimes included in an integrated circuit, so that a defect in one subcircuit can be overcome by substituting a "spare" subcircuit in its place. In some approaches the substitution is performed dynamically by the hardware itself; in others, the integrated circuit is tested immediately after manufacture, and a laser or some other means is used to burn away certain interconnections so that defective subcircuits are disconnected from the functional portions of the integrated circuit.

It has generally been considered impossible or impractical to employ similar redundancy in radio frequency (R.F.) integrated circuits, because a "spare" circuit element fabricated at one location within an integrated circuit chip cannot readily be substituted for a defective circuit element at another location. The physical separation of circuit elements is tightly constrained by capacitances and inductances between circuit elements.

SUMMARY OF THE INVENTION

The present invention is a method of designing and fabricating a radio frequency (R.F.) integrated circuit wherein one or more of the active devices within the integrated circuit chip are electrically tested before the final interconnections are made between circuit components. Based on the results of the tests, the desired radio frequency circuit can be laid out on the chip so as to avoid including any defective active devices within the circuit. The final lay out of the circuit preferably is implemented by adding one or more metallization layers over the chip to create a pattern of electrical interconnections among the circuit components to form the desired circuit.

In one embodiment of the invention, the input and output impedances of the active devices are measured at the frequencies of intended operation of the circuit, and then the metallization layer is deposited in a pattern which forms impedance-matching transmission lines interconnecting the active devices (as well as passive devices such as capacitors).

In another embodiment of the invention, more sophisticated tests may be performed on the active devices to measure their performance according to some figure of merit such as noise figure, gain, bandwidth, or a combination of these or other electrical parameters. The desired radio frequency circuit can then be laid out so as to incorporate the active devices having the highest figures of merit in critical portions of the circuit. In a yet more sophisticated embodiment, the measured parameters of the active devices are inputted to a computer model or simulation of the desired R.F. circuit, and the simulation is used to calculate the performance of the R.F. circuit as a function of which of the active devices are included in the circuit. The R.F. circuit can then be laid out so that the active devices are used in the portions of the circuit that result in best overall circuit performance.

BRIEF DESCRIPTION OF THE DRAWING

FIG. 1 is a plan view of the top surface of an R.F. integrated circuit according to the present invention, showing the metallization layer and the uppermost semiconductor layer.

DETAILED DESCRIPTION OF THE PREFERRED EMBODIMENTS

FIG. 1 shows an integrated circuit in which the method of the present invention has been used to design and fabricate a monolithic microwave integrated circuit 10 consisting of a two-stage low noise amplifier 2, a mixer 3, and an intermediate-frequency amplifier 4.

The first step in the fabrication of an R.F. integrated circuit in accordance with the present invention is to fabricate an array of electrical components in a semiconductor substrate by conventional semiconductor integrated circuit processing techniques. The electrical components generally include active devices such as transistors, as well as passive devices such as capacitors and inductors. The array of components in the R.F. integrated circuit 10 illustrated in FIG. 1 includes transistors 11-26, bypass capacitors 30-37, and interstage coupling capacitors 40-49. (FIG. 1 also shows a number of metallic conductors 50-58, but these are not fabricated until a later step, as explained below.)

In the illustrated circuit, four transistors are fabricated in the integrated circuit chip for every one transistor that is needed in the desired R.F. circuit. Specifically, the four transistors 11-14 are fabricated in order to provide the one transistor needed for the first stage of low noise amplifier 2, transistors 15-18 are fabricated to provide the one transistor needed for the second stage of low noise amplifier 2, transistors 19-22 are fabricated to provide the one transistor needed for mixer 3, and transistors 23-26 are fabricated to provide the one transistor needed for I.F. amplifier 4. In the illustrated preferred embodiment, the four transistors provided for use in any one stage of the circuit (e.g., transistors 11-14) are fabricated adjacent each other along one linear dimension of the chip (the vertical dimension in the FIGURE), and the components for successive stages are fabricated in successive locations along the orthogonal linear dimension on the chip (the horizontal dimension in the FIGURE).

After the above-described electrical components have been fabricated on the integrated circuit chip, each transistor 11-26 is individually tested for electrical performance. The test may be a simple D.C. test to determine which transistors are defective. The test may also include measurement of R.F. performance characteristics of each transistor such as noise figure, gain, bandwidth, and input and output impedances at the desired frequencies of operation of the R.F. circuit being designed. Each transistor is evaluated according to some set of performance parameters (collectively referred to as a "figure of merit") appropriate to the type of circuit it will be used in. For example, noise figure may be the most important performance parameter for the transistors 11-18 to be used in the low noise amplifier 2, whereas gain may be the most important parameter for the transistors 23-26 to be used in the I.F. amplifier 4.

The transistor having the highest figure of merit is then selected for each stage of the R.F. circuit. In the circuit illustrated in the FIGURE, transistor 12 is selected as being the best of transistors 11-14 for use in the first stage of the low noise amplifier 2, transistor 17 is selected as being the best of transistors 15-18 for use in the second stage of low noise amplifier 2, transistor 19 is selected for the mixer, and transistor 24 is selected for the I.F. amplifier.

Next, the R.F. circuit is completed by depositing on the integrated circuit chip a metallization layer which comprises conductors 50-59. The conductors function to connect the selected transistors (12,17,19,24) to each other and to selected passive devices (capacitors 30,31,33-37,40-44) in order to form a complete R.F. circuit. Preferably, the integrated circuit chip 10 includes a conductive layer (not shown) beneath the transistors which functions as a ground plane, and each conductor 50-59 functions as an R.F. transmission line in conjunction with the ground plane. Each conductor 50-59 should be dimensioned so the transmission line it forms properly matches the respective impedances of the transistors it interconnects. For example, transmission lines 52 and 53, which are connected in series through coupling capacitor 41, should be dimensioned to effect an impedance match between the output impedance of transistor 12 and the input impedance of transistor 17. This impedance matching can be more precise if the transistor input and output impedances were measured as part of the performance parameter testing described above.

Using a computer-aided design system to model or simulate the R.F. circuit being designed, an even more sophisticated design approach is possible. The computer model can be designed to calculate the overall performance of the entire R.F. circuit as a function of the measured parameters of the transistors used in the circuit. The computer model can be programmed to compare the circuit performance when different combinations of circuit components (both active and passive devices) are used, and thereby select which components should be selected for inclusion in the final circuit.

Because passive components are usually relatively large and are almost never defective, it is generally undesireable to include too many redundant passive components in the component array fabricated on the chip. In contrast, transistors are usually relatively small but are much more frequently defective or of sub-standard performance, so it is generally desireable to include many redundant transistors on the chip.

We claim:

1. A method of fabricating a RF semiconductor integrated circuit for operation at radio frequencies, which RF semiconductor integrated circuit includes at least one active semiconductor device of a first type coupled in an RF transmission circuit with at least one active semiconductor device of a second type, comprising the steps of:

fabricating an integrated circuit chip having a plurality of circuit components to a stage of completion below the interconnect wiring level, said integrated circuit chip including at least one passive device and at least two active RF semiconductor devices of a first type with said active RF semiconductor devices having a predetermined characteristic impedance and being located at spaced locations on said chip and at least two active RF semiconductor devices of a second type with said active RF semiconductor devices having a predetermined characteristic impedance and being located at spaced locations on said chip; and wherein said number of active RF semiconductor devices of each of said first and second type exceeds the number of corresponding active devices required to form said RF semiconductor integrated circuit;

testing the electrical performance of at least one of the active RF semiconductor devices of each type to determine the performance characteristics thereof;

selecting one of said first and second type active devices for inclusion in said RF semiconductor integrated circuit; and adding at least one layer of electrical conductors to said integrated circuit for interconnecting selected ones of said circuit components in an RF transmission circuit, including said selected first and second type active devices, with said conductors defining RF transmission lines having a characteristic impedance matched to the characteristic impedance of said selected active devices to form a radio frequency integrated circuit, while leaving at least one active device of each of said first and second type active devices unconnected.

2. A method according to claim 1, wherein said step of testing the electrical performance includes the step of: measuring at least one radio frequency performance parameter of each tested active device and deriving a figure of merit for that device from the measurements; and wherein said step of adding electrical conductors includes the step of: placing the electrical conductors on the chip to interconnect only those of said first and second type active devices whose figure of merit exceeds a desired value.

3. A method according to claim 2, wherein one of said parameters measured comprises gain.

4. A method according to claim 2, wherein one of said parameters measured comprises a noise figure.

5. A method according to claim 4, wherein a further one of said parameters measured comprises gain.

6. A method according to claim 1, wherein one of said measured parameters is the output impedance of said first type active device;

another one of the measured parameters is the input impedance of said second type active device; and said electrical conductors include conductors positioned so as to form a transmission line connecting an output of said selected first active device to an input of said selected second active device, the conductor being dimensioned so as to form an impedance matching network which matches said measured output impedance of the selected one of said first type active device to said measured input impedance of the selected one of said second type active device.

7. A method according to claim 1, wherein: the testing step includes measuring at least one radio frequency performance parameter of each device; the method further comprises the steps, following the testing step and preceding the adding step, of: (i) simulating and calculating the performance of a radio frequency circuit which includes selected ones of the active devices and repeating said calculation for different ones of the active devices, the simulation being based on the measured performance parameters of the selected active devices, and (ii) comparing the simulated performance of the simulated radio frequency circuit when different ones of the active devices are selected to be included in the circuit to determine which simulation obtains a maximum performance; wherein the simulation and comparing steps may be performed in any order; and wherein the adding step includes interconnecting those selected ones of the circuit components as was determined to provide maximum performance for the radio frequency circuit based on said comparisons of simulated performance in the preceding steps.

8. A radio frequency semiconductor integrated circuit formed by a method of fabricating a RF semiconductor integrated circuit for operation at radio frequencies, which RF semiconductor integrated circuit includes at least one active semiconductor device of a first type coupled in an RF transmission circuit with at least one active semiconductor device of a second type, comprising the steps of:

fabricating an integrated circuit chip having a plurality of circuit components to a stage of completion below the interconnect wiring level, said integrated circuit chip including at least one passive device and at least two active RF semiconductor devices of a first type with said active RF semiconductor devices having a predetermined characteristic impedance and being located at spaced locations on said chip and at least two active RF semiconductor devices of a second type with said active RF semiconductor devices having a predetermined characteristic impedance and being located at spaced locations on said chip; and wherein said number of active RF semiconductor devices of each of said first and second type exceeds the number of corresponding active devices required to form said RF semiconductor integrated circuit;

testing the electrical performance of at least one of the active RF semiconductor devices of each type to determine the performance characteristics thereof;

selecting one of said first and second type active devices for inclusion in said RF semiconductor integrated circuit; and adding at least one layer of electrical conductors to said integrated circuit for interconnecting selected ones of said circuit components in an RF transmission circuit, including said selected first and second type active devices, with said conductors defining RF transmission lines having a characteristic impedance matched to the characteristics impedance of said selected active devices to form a radio frequency integrated circuit, while leaving at least one active device of each of said first and second type active devices unconnected.

9. A method of fabricating a RF semiconductor integrated circuit for operation at radio frequencies, which RF semiconductor integrated circuit includes an active semiconductor device of a first type coupled in an RF transmission circuit with at least one active semiconductor device of a second type, and with said second type active semiconductor device being in turn coupled in an RF transmission circuit with an active semiconductor device of a third type, comprising the steps of:

fabricating an integrated circuit chip having a plurality of circuit components to a stage of completion below the device interconnect wiring level, said integrated circuit chip including at least one passive device and at least two active RF semiconductor devices of a first type with said active RF semiconductor devices having a predetermined characteristic impedance and being located at spaced locations on said chip and at least two active RF semiconductor devices of a second type with said active RF semiconductor devices having a predetermined characteristic impedance and being located at spaced locations on said chip and at least two active RF semiconductor devices of a third type with said active RF semiconductor devices having a predetermined characteristic impedance and being located at spaced locations on said chip; and wherein said number of active RF semiconductor devices of each of said first, second and third type exceeds the number of corresponding active devices required to form said RF semiconductor integrated circuit;

testing the electrical performance of at least one of the active RF semiconductor devices of each type to determine performance characteristics thereof;

selecting one of said first, second and third type active devices for inclusion in said RF semiconductor integrated circuit; and adding at least one layer of electrical conductors to said integrated circuit for interconnecting selected ones of circuit components in an RF transmission circuit, including said selected first, second and third type active devices, with said conductors defining RF transmission lines having a characteristic impedance matched to the characteristic impedance of said selected active devices to form a radio frequency integrated circuit, while leaving at least one active device of each of said first, second and third type active devices unconnected.

10. The method as defined in claim 9 wherein said first type active device comprises a low noise amplifier device; said second type active device comprises a mixer device; and said third type active device comprises an IF amplifier device.

* * * * *